(12) United States Patent
Zhang (10) Patent No.: US 7,633,128 B2
(45) Date of Patent: Dec. 15, 2009

(54) N-ARY MASK-PROGRAMMABLE MEMORY

(76) Inventor: Guobiao Zhang, P.O. Box 6182, Stateline, NV (US) 89449-6182

( * ) Notice: Subject to any disclaimer, the term of this patent is extended or adjusted under 35 U.S.C. 154(b) by 517 days.

(21) Appl. No.: 11/162,262

(22) Filed: Sep. 2, 2005

(65) Prior Publication Data

US 2007/0013003 A1  Jan. 18, 2007

Related U.S. Application Data

(60) Provisional application No. 60/700,037, filed on Jul. 15, 2005.

(51) Int. Cl.
*H01L 29/76* (2006.01)

(52) U.S. Cl. .................. 257/390; 257/211; 257/368; 257/401; 341/56

(58) Field of Classification Search .............. 257/211, 257/368, 390, 401; 341/56
See application file for complete search history.

(56) References Cited

U.S. PATENT DOCUMENTS

| | | | |
|---|---|---|---|
| 4,404,655 A | 9/1983 | Naiff | 365/104 |
| 4,603,341 A | 7/1986 | Bertin et al. | 357/23.7 |
| 4,796,074 A | 1/1989 | Roesner | 357/51 |
| 5,257,224 A | 10/1993 | Nojiri et al. | 365/175 |
| 5,272,370 A | 12/1993 | French | 257/353 |
| 5,455,435 A | 10/1995 | Fu et al. | 257/328 |
| 5,751,012 A | 5/1998 | Wolstenholme et al. | 257/5 |
| 5,825,686 A | 10/1998 | Schmitt-Landsiedel et al. | 365/185.03 |
| 5,835,396 A | 11/1998 | Zhang | 365/51 |
| 5,841,150 A | 11/1998 | Gonzalez et al. | 257/3 |
| 5,843,824 A | 12/1998 | Chou et al. | 438/278 |
| 5,847,442 A | 12/1998 | Mills, Jr. et al. | 257/536 |
| 5,854,111 A | 12/1998 | Wen | 438/275 |
| 5,943,255 A | 8/1999 | Kutter et al. | 365/94 |
| 6,385,074 B1 | 5/2002 | Johnson et al. | 365/103 |
| 6,420,215 B1 | 7/2002 | Knall et al. | 438/131 |
| 6,624,485 B2 | 9/2003 | Johnson et al. | 257/390 |
| 6,646,913 B2 | 11/2003 | Micheloni et al. | 365/185.03 |
| 6,717,222 B2 * | 4/2004 | Zhang | 257/390 |
| 6,809,948 B2 | 10/2004 | Nachumovsky et al. | 365/96 |
| 6,816,407 B2 | 11/2004 | Rolandi | 365/185.03 |
| 6,822,898 B2 | 11/2004 | Matsui | 365/185.03 |
| 7,071,849 B2 | 7/2006 | Zhang | 341/56 |
| 2005/0050434 A1 | 3/2005 | Lunelli et al. | 714/793 |

OTHER PUBLICATIONS

Gibson, "The Characteristics of High Current Amorphous Silicon Diodes", *Applied Physics*, pp. 307-311, vol. 21, 1980.

Verghese et al. "Forward-Bias Conduction of Schottky Diodes on Polysilicon Thin Films", *IEEE Transactions on Electron Devices*, pp. 1311-1317, Jul. 1989.

Tanaka et al. "A 3.4-Mbyte/sec Programming 3-Level NAND Flash Memory Saving 40% Die Size Per Bit", *1997 Symposium on VLSI Circuits Digest of Technical Papers*, pp. 65-66.

Gerstner et al. "Formation of Bulk Unipolar Diodes in Hydrogenated Amorphous Silicon by Ion Implantation", IEEE Electron Device Letters, pp. 536-538, Nov. 2001.

Micheloni et al. "The Flash Memory Read Path: Building Blocks and Critical Aspects", *Proceedings of the IEEE*, pp. 537-551, Apr. 2003.

* cited by examiner

*Primary Examiner*—Edward Wojciechowicz (57) ABSTRACT

The present invention discloses an N-ary mask-programmable memory (N-MPM). N-MPM cells can have N cell-states, with N>2. N-MPM cells could be geometry-defined, junction-defined, or both. Based on an nF-opening process ($n \geq 1$), partial-contacts with feature size <1F can be implemented with an nF-opening mask with feature size $\geq$1F. N can be a non-integral power of 2. In this case, each memory cell represents fractional bits.

20 Claims, 10 Drawing Sheets

| $r$ | "$0_4$" | "$1_4$" | "$2_4$" | "$3_4$" |
|---|---|---|---|---|
| Even Distribution | 0 | 0.33 | 0.67 | 1 |
| Un-even Distribution | 0 | 0.37 | 0.64 | 1 |

னாய் MASK-PROGRAMMABLE MEMORY

N-ARY MASK-PROGRAMMABLE MEMORY

CROSS-REFERENCE TO RELATED APPLICATIONS

This application is related to a provisional application Ser. No. 60/700,037, entitled "N-ary Mask Programmable Memory", Filed Jul. 15, 2005.

BACKGROUND

1. Technical Field of the Invention

The present invention relates to the field of integrated circuits, and more particularly to mask-programmable memory (MPM).

2. Prior Arts

Figure 1A:
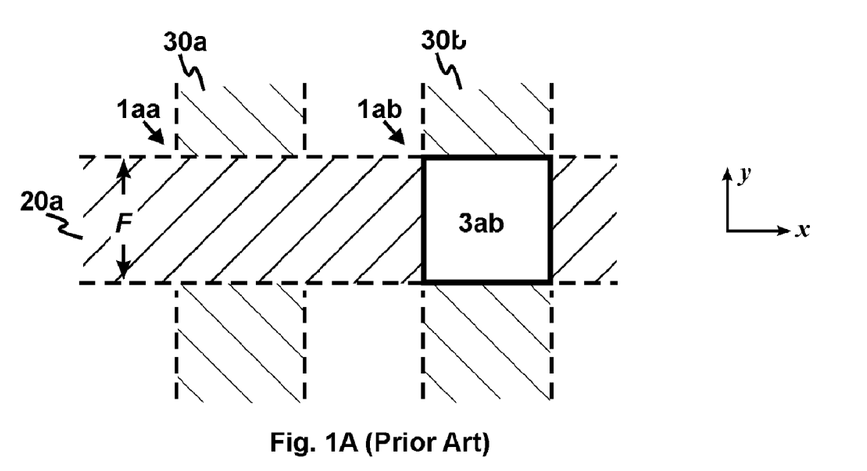
FIG. 1A illustrates two prior-art mask-programmable memory (MPM) cells $1aa$, $1ab$.
Figure 1B:
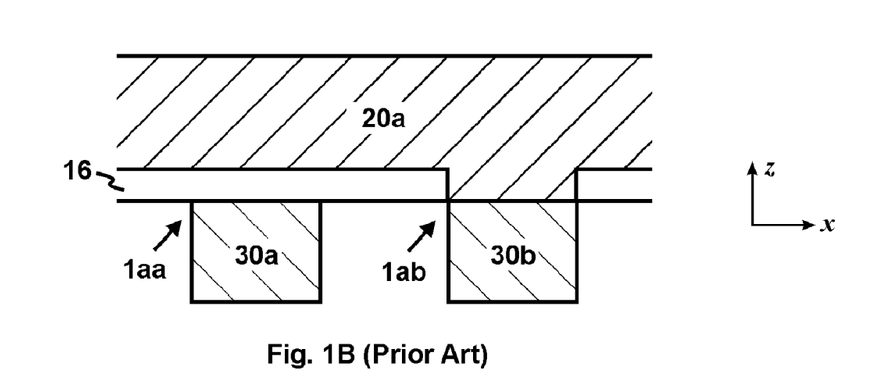
FIG. 1B is the cross-sectional view of cells $1aa$, $1ab$.

With a large storage capacity, low cost and excellent security, mask-programmable memory (MPM) is considered as an ideal storage medium for multimedia contents and others. FIGS. 1A-1B illustrate two prior-art MPM cells. Among these, cell $1aa$, located at the intersection of upper address-selection line (ASL) $20a$ and lower ASL $30a$, comprises no contact. It has large contact resistance and therefore, represents "0". On the other hand, cell $1ab$ comprises a full contact $3ab$. It has low contact resistance and represents "1". These prior-art cells can have only two states: no-contact or full-contact. Thus, each cell can represent only one bit of digital information. As a result, the MPM storage density is limited. To increase the storage density, the present invention discloses an N-ary mask-programmable memory (N-MPM).

OBJECTS AND ADVANTAGES

It is a principle object of the present invention to improve the storage density of mask-programmable memory.

It is a further object of the present invention to form an N-ary mask-programmable memory by varying cell geometries.

It is a further object of the present invention to manufacture an N-ary mask-programmable memory using less expensive opening masks.

It is a further object of the present invention to form an N-ary mask-programmable memory by varying junction properties.

In accordance with these and other objects of the present invention, an N-ary mask-programmable memory is disclosed.

SUMMARY OF THE INVENTION

The present invention discloses an N-ary mask-programmable memory (N-MPM) (N>2). Its memory cells have N distinct cell-states. In other words, each of its memory cells can stay at one of these N cell-states. An N-MPM stores digital information as N-ary code. It has a larger storage density than a conventional binary MPM (2-MPM). An N-MPM can be geometry-defined, junction-defined, or both.

In a geometry-defined N-MPM, distinct cell-states are defined by varying cell geometries. Commonly varied cell geometry is contact-area, which is the final physical area on silicon where the upper address-selection line (ASL) makes electrical contacts with the lower ASL. To form N-MPM with N>2, besides no-contact and full-contact, partial-contact(s) are needed. In a partial-contact, contact-area is located within the ASL-overlapping-area (i.e. the overlapping area between the upper and lower ASL's). When an nF-opening process (F-ASL line width) is used, partial-contacts (feature size <1F) can be implemented with an nF($n \geq 1$)-opening mask (feature size $\geq 1F$). This is because in this process, contact-area is formed at the intersection of the ASL-overlapping-area and contact-opening (i.e. the opening pattern formed in the photo-resist by the opening mask during the manufacturing process).

In a junction-defined N-MPM, distinct cell-states are defined by varying junction properties. A commonly varied junction property is doping profile. With different doping profiles, the cell IV characteristics vary. The read-out process comprises several read-phases. During different read-phases, the read voltages applied to the word line are different and smaller read voltages are applied first. If, during a read-phase, a cell-under-read is sensed as "1" (i.e. its read current is large enough to trigger the sense-amp), then during later read-phases, a current-limiting circuit will be turned on and limit the current flow through said cell. This can protect said cell from being damaged by excessively large current.

In an N-MPM, each cell could store an integral number of bits, or fractional number of bits. When N is an integral power of 2 (i.e. $N=2^n$, n is an integer), each N-MPM cell can represent integral bits (i.e. n bit, $n \geq 2$ is an integer). When N is a non-integral power of 2 (i.e. $N=2^x$, x is a non-integer), a plurality of cells are decoded collectively—in unit of word. Each word comprises m N-MPM cells (m—word-width, $m \geq 2$ is an integer). They are fed into an N-ary-to-binary encoder and converted into i binary bit, where $$i \leq INT[\log_2(N^m)]$$

(INT[x] is the largest integer smaller than x). By averaging i bits into m cells, each N-MPM cell effectively represents fractional bits (referring to U.S. patent application Ser. No. 10/907,381, entitled "Fractional-Bit Systems", filed Mar. 31, 2005).

BRIEF DESCRIPTION OF THE DRAWINGS

FIGS. 3AA-3AC is a top view, y-z cross-sectional view and z-x cross-sectional view of a first preferred geometry-defined N-MPM cell; FIGS. 3BA-3BC is a top view, y-z cross-sectional view and z-x cross-sectional view of a second preferred geometry-defined N-MPM cell; FIGS. 3CA-3CC is a top view, y-z cross-sectional view and z-x cross-sectional view of a third preferred geometry-defined N-MPM cell;

This disclosure is focused on opening patterns and read-out circuits of N-MPM. In some cross-sectional drawings, diode layers (or other ROM layers) of the N-MPM are intentionally left un-drawn. Details on these layers can be found in U.S. Pat. No. 5,835,396, "Three-Dimensional Read-Only Memory"; U.S. Pat. No. 6,717,222, "Three-Dimension Memory", both by the same inventor.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

Figure 2:
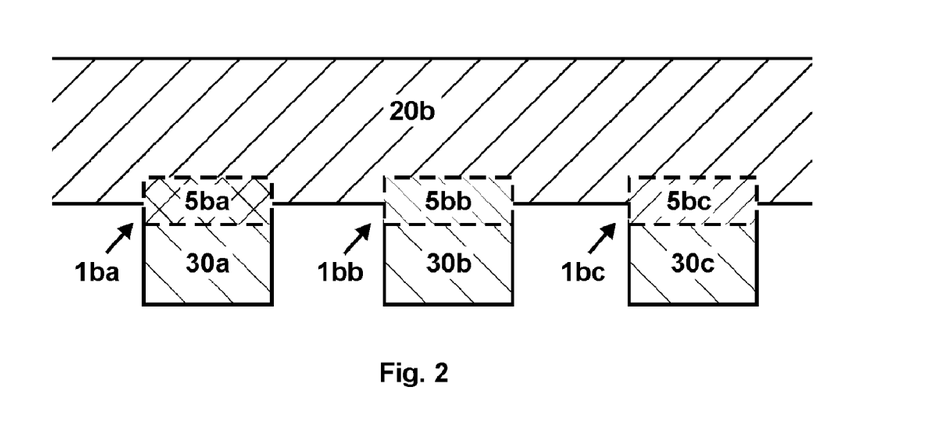
FIG. 2 illustrates a preferred N-ary MPM (N-MPM)

The present invention discloses an N-ary mask-programmable memory (N-MPM) (N>2). Its memory cells have N distinct cell-states. In other words, each of its memory cells can stay at one of these N cell-states. As illustrated in FIG. 2, the memory cells 1*ba*-1*bc* of this 3-MPM (N-MPM with N=3) have 3 distinct cell-states, which are denoted by different shadings in cell areas 5*ba*-5*bc*. An N-MPM stores digital information as N-ary code. For example, number $11_{10}$ is stored in a 3-MPM as $102_3$. Here, expression $C_N$ means that code C is an N-ary code, e.g. $11_{10}$ means code 11 is a 10-ary code; $102_3$ means code 102 is a 3-ary code. Because it takes three 3-MPM cells to store a number like $11_{10}$ ($11_{10}=102_3$), but four cells in 2-MPM ($11_{10}=1011_2$), 3-MPM has a larger storage density than 2-MPM. Apparently, with a larger N, the storage density of the N-MPM becomes larger.

Figure 3:
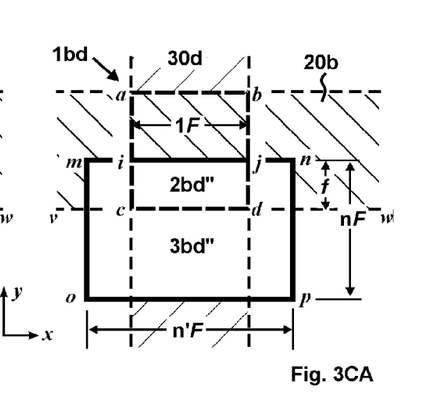

FIGS. 3AA-3CC illustrate a first preferred N-MPM type-geometry-defined N-MPM. In a geometry-defined N-MPM, distinct cell-states are defined by varying cell geometries. Commonly varied cell geometry is contact-area, which is the final physical area on silicon where the upper address-selection line (ASL) makes electrical contacts with the lower ASL. To form N-MPM with N>2, besides no-contact and full-contact, partial-contact(s) are needed.

Referring now to FIGS. 3AA-3AC, a first preferred geometry-defined N-MPM cell 1*bd* is illustrated. It uses a partial-contact and its contact-area "efgh" 2*bd* is located near the center of the ASL-overlapping-area "abcd" (i.e. the overlapping area between the upper ASL 20*b* and lower ASL 30*d*). The contact-area ratio r, defined as the areal ratio between the contact-area "efgh" and ASL-overlapping-area "abcd", can be expressed as:

*r*=(contact-area)/(ASL-overlapping-area)=*f*/F where F is the ASL line width. Accordingly, contact resistance $R_c$ of cell 1*bd* is ~1/r larger than a cell with full-contact (e.g. cell 1*ab* of FIG. 1A), but much smaller than a cell with no-contact (e.g. cell 1*aa* of FIG. 1A).

To implement the partial contact of FIG. 3AA, the preferred embodiment of FIGS. 3AA-3AC needs to use a sub-1F-opening mask (feature size <1F), which could be expensive. On the other hand, based on an nF-opening process (referring to FIGS. 4A-4D for details), an nF($n \geq 1$)-opening mask (feature size $\geq$1F) can be used to implement the same partial contact. This is illustrated in FIGS. 3BA-3CC.

FIGS. 3BA-3BC illustrate a second preferred geometry-defined N-MPM cell 1*bd'*. Its contact-opening "ijkl" 3*bd'* (i.e. the opening pattern formed in the photo-resist by the opening mask during the manufacturing process) has a feature size of 1F, i.e. a dimension of 1F×1F. It is shifted against the upper ASL 20*b* by an offset S(=1F−f) along the −y direction. Based on an nF-opening process, the final contact-area "ijcd" 2*bd'* is formed at the intersection of ASL-overlapping-area "abcd" and contact-opening "ijkl" 3*bd'* and has a dimension of f×1F; same in size as the contact-area 2*bd* of FIG. 3AA. In this preferred embodiment, the contact-area 2*bd'* is located at the edge of the ASL-overlapping-area "abcd", and one of its contact-edges "cd" (i.e. edge of contact-area) coincides with a line-edge "vw" of the upper ASL 20*b*.

FIGS. 3CA-3CC illustrate a third preferred geometry-defined N-MPM cell 1*bd"*. Its contact-opening "mnop" 3*bd"* has a feature size of >1F; i.e. a dimension of nF×n'F, with both n, n'>1. Compared with FIG. 3BA, the contact-opening 3*bd"* not only expands along the −y direction, but also along +x and −x directions. Based on an nF-opening process, the final contact-area 2*bd"* is formed at the intersection of ASL-overlapping-area "abcd" and contact-opening "mnop" 3*bd"*. As long as the contact-opening 3*bd"* overlaps with the upper ASL 20*b* by f along the y direction, the contact-area 2*bd"* still has a dimension of f×1F, same as FIG. 3AA. Similarly, the contact-area 2*bd"* is located at the edge of the ASL-overlapping-area.

In FIGS. 3BA-3CC, the feature size of contact-openings 3*bd'*, 3*bd"* is $\geq$1F Accordingly, the opening mask associated with these contact-openings is referred to as nF($n \geq 1$)-opening mask. Apparently, nF-opening mask is less expensive than the sub-1F-opening mask (used for FIGS. 3AA-3AC). Furthermore, in FIG. 3CA, the final shape of the contact-area 2*bd"* is only defined by contact-edge "ij", not by any other contact-edges (e.g. "mo", "op"). As a result, during the making of the opening mask, except for "ij", contact-opening does not require critical edge control. Namely, the nF-opening mask could be a low-precision mask. This can further help drive down the mask cost.

Figure 4A:
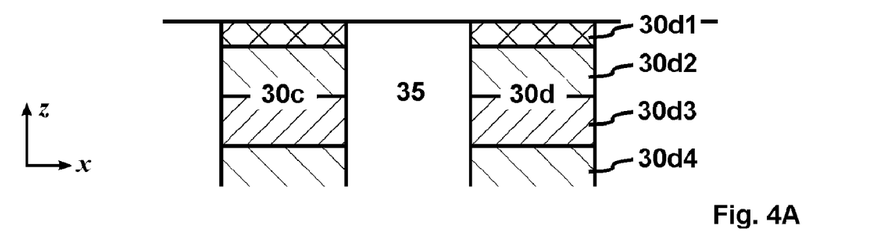
FIGS. 4A-4D illustrate the manufacturing steps of a preferred nF-opening process.
Figure 4B:
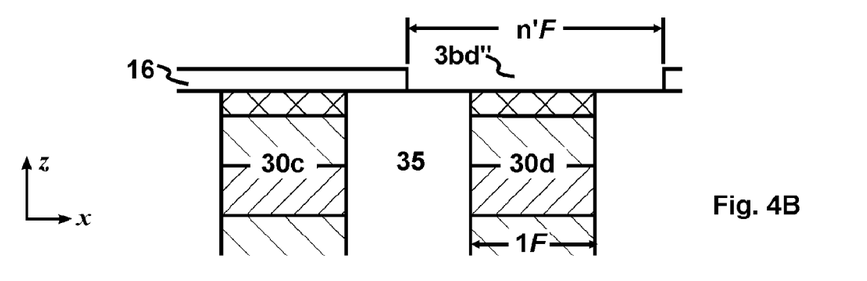
Figure 4C:
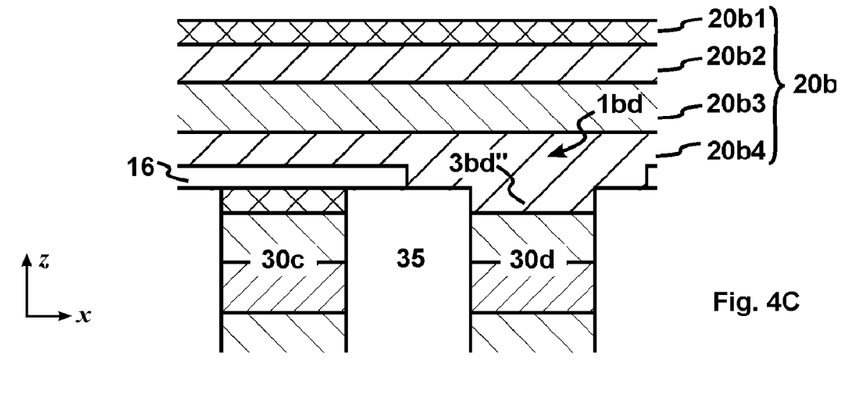
Figure 4D:
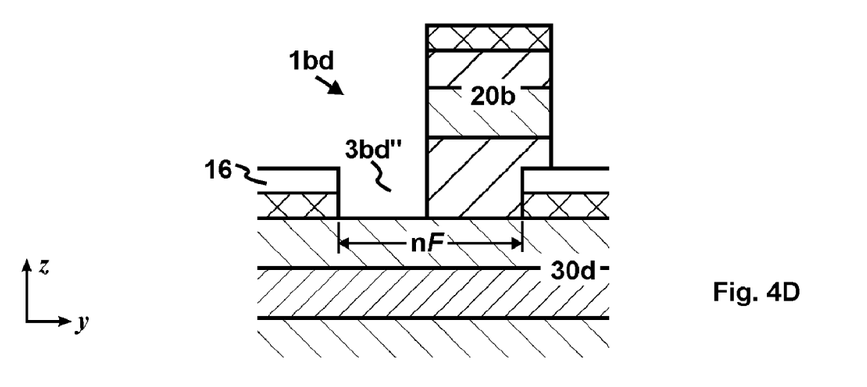

Referring now to FIGS. 4A-4D, a preferred manufacturing process for the N-MPM structure in FIGS. 3CA-3CC is disclosed. Because it uses an nF-opening mask, this process is also referred to as nF-opening process. FIGS. 4A-4C are the z-x cross-sectional views; FIG. 4D is the y-z cross-sectional view. It comprises the following steps:

A) Deposit a first N-silicon layer 30*d*4, a conductive layer 30*d*3, a second N-silicon layer 30*d*2 and a polish-stop layer 30*d*1. The polish-stop layer 30*d*1 (e.g. silicon nitride) is optional and can act as a stop layer for the CMP step. After the deposition, etch these layers to form the lower ASL's 30*c*, 30*d* and fill in an intra-level dielectric 35 there-between. Next, perform a CMP step until the polish-stop layer 30*d*1 is exposed.

B) Deposit an insulating dielectric 16 on top of the planarized lower ASLs 30*c*, 30*d*. Apply the nF-opening mask and remove the insulating dielectric 16 at selected locations (e.g. 3*bd"*). Because n>1, the resultant contact-opening 3*bd"* has dimensions (nF, n'F; with n, n'>1) larger than the ASL (e.g. 30*d*) width (1F).

C) Remove the polish-stop layer 30*d*1 until the second N-silicon layer 30*d*2 is exposed. Deposit a first P-silicon layer 20*b*4, another conductive layer 20*b*3, a second P-silicon layer 20*b*2, and another polish-stop layer 20*b*1. Etch these layers to form the upper ASL 20*b*.

From the above processing steps, it can be observed that, in an nF-opening process, contact-area is formed at the intersection of ASL-overlapping-area and contact-opening. As a result, contact-openings can expand outside the ASL-overlapping-area. Furthermore, they can merge with contact-openings from adjacent cells and form a single opening.

Figure 5A:
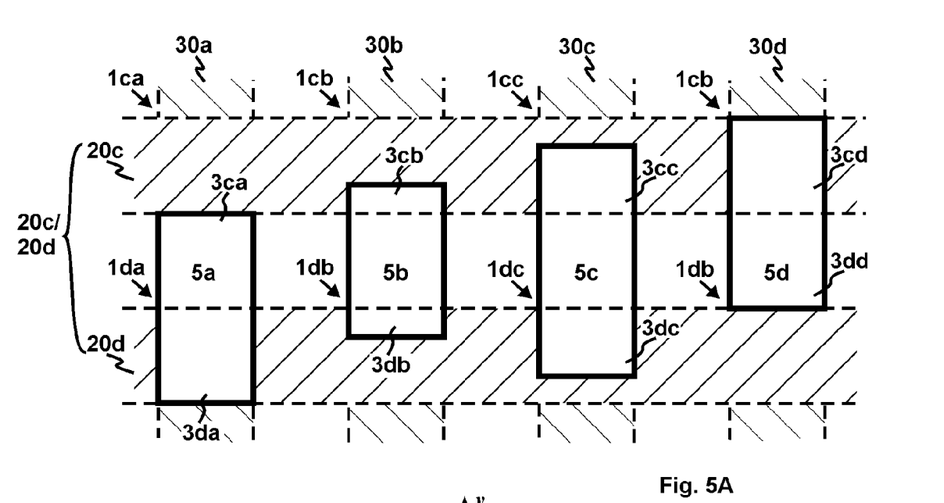
FIGS. 5A-5B illustrate two preferred 4-ary MPM (4-MPM) with merged openings.
Figure 5B:
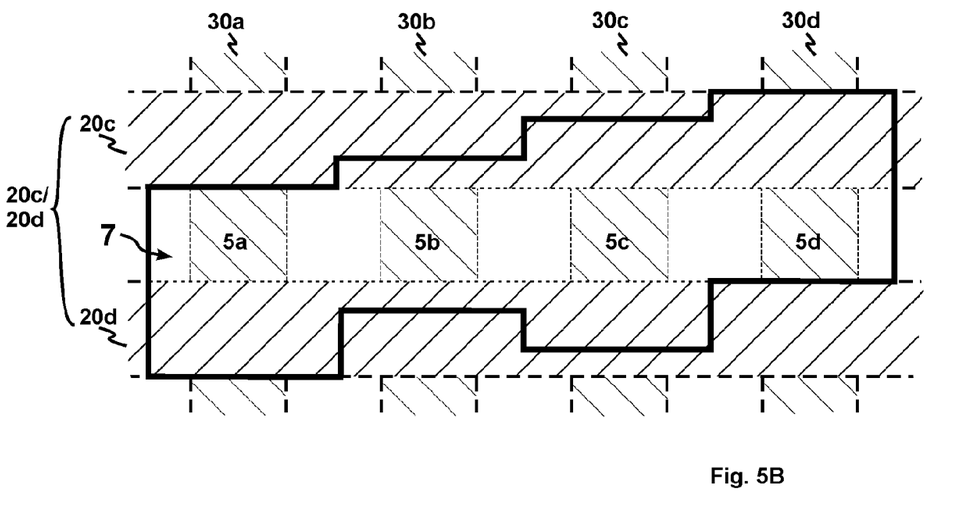

Referring now to FIGS. 5A-5B, two preferred 4-MPM cells with merged openings are disclosed. In FIG. 5A, 4-MPM cells 1ca, 1cb, 1cc, 1cd represent "$0_4$", "$1_4$", "$2_4$", "$3_4$", respectively. This is realized by shifting the contact-openings 3ca, 3cb, 3cc, 3cd against the ASL 20c by different offsets, e.g. 1F, ⅔F, ⅓F, 0. In this preferred embodiment, adjacent upper ASLs (e.g. 20c and 20d) are grouped into an ASL-pair 20c/20d; and contact-openings on this ASL-pair 20c/20d are shifted towards each other. For example, contact-opening 3cb is shifted towards 3db by −2F/3, while contact-opening 3db is shifted towards 3cb by +2F/3; they naturally merge into a single opening 5b (enclosed by thick dark line). For another example, contact-opening 3cc is shifted towards 3dc by −F/3, while contact-opening 3dc is shifted towards 3cc by +F/3. Based on the nF-opening process, contact-openings 3cc, 3dc can expand outside the ASL-overlapping-area. After the expansion, they are merged into a single opening 5c (enclosed by thick dark line). Note the y dimensions of all openings in FIG. 5A are >1F.

In FIG. 5B, openings 5a-5d of FIG. 5A can further expand along the +x and −x directions until they merge with their respective neighbors. For example, opening 5c can expand towards +x direction until it merges with 5d; it can also expand towards the −x direction until it merges with 5b. In fact, all openings 5a-5d on the ASL-pair 20c/20d can be merged into a single opening 7 (enclosed by thick dark line). Its minimum feature size is 5F/3 (at the location of opening 5b). Apparently, the opening-mask associated with this preferred embodiment has a significantly lower cost. It should be noted that the rightmost and leftmost edges of the opening 7 can still further expand (to right and left, respectively) and merge with openings not shown on this drawing sheet. It is also possible for opening 7 to merge with openings from adjacent ASL-pairs.

Figure 6A:
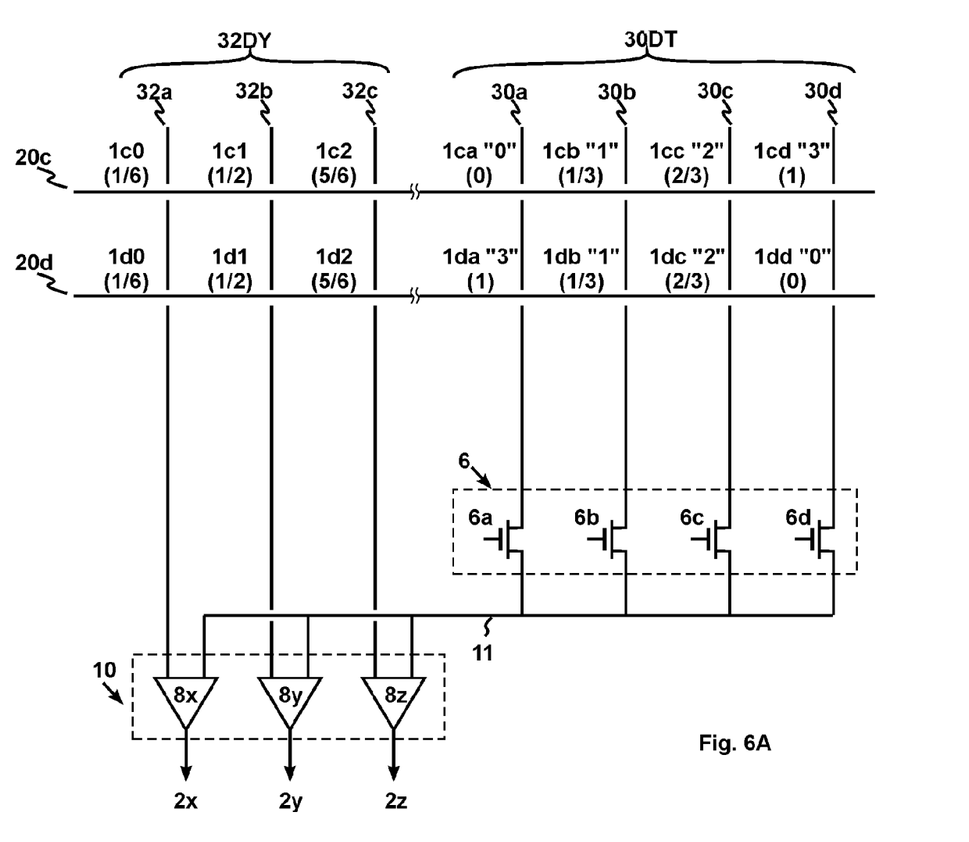
FIGS. 6A-6C illustrate three preferred read-out circuits for an N-MPM.
Figure 6B:
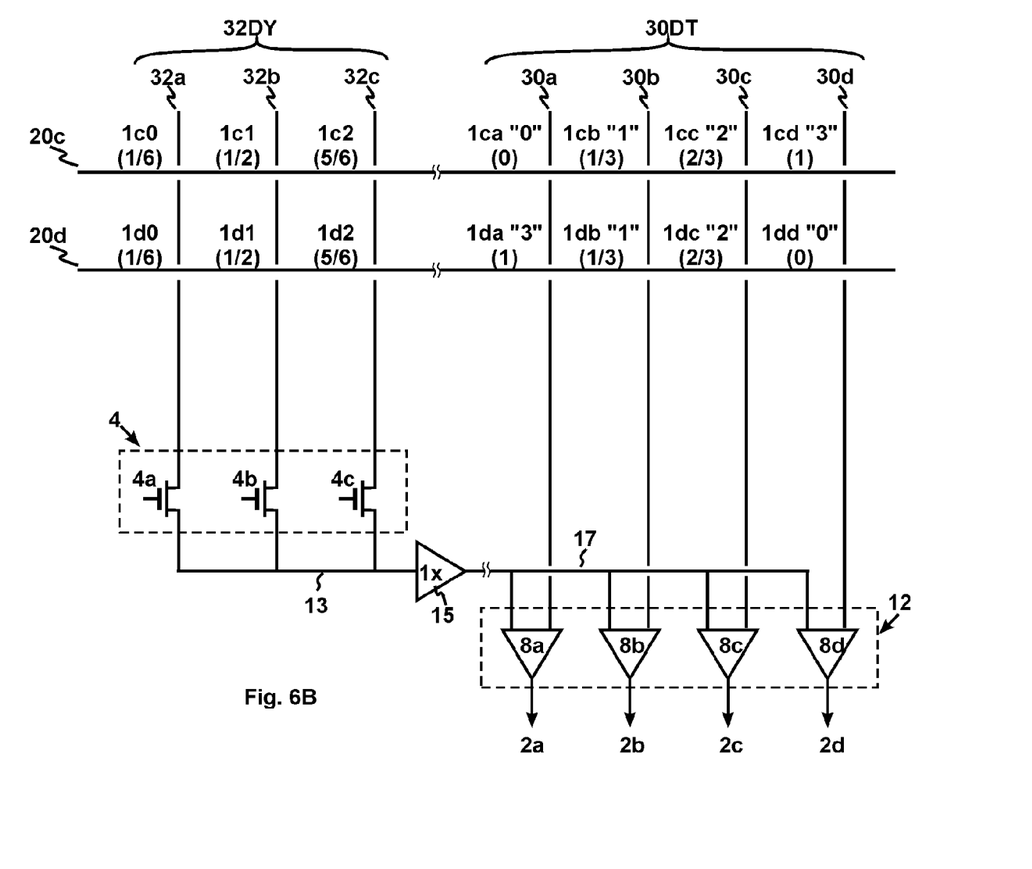
Figure 6C:
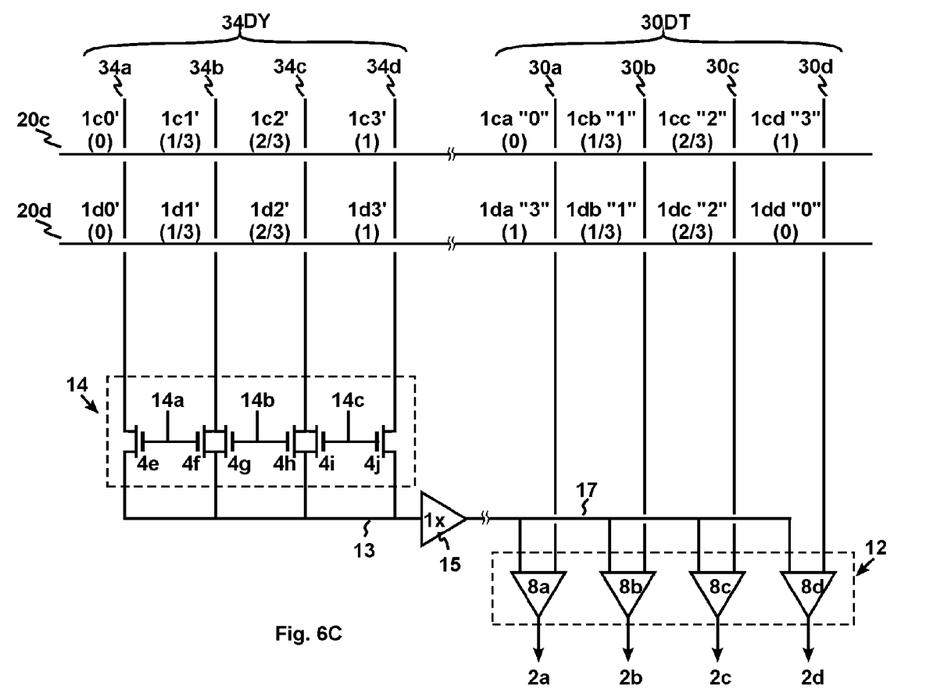

Referring now FIGS. 6A-6C, three preferred read-out circuits for an N-MPM are disclosed. They use dummy cells to provide reference bit-line voltage. Similar to memory cells, dummy cells comprise contact-areas with different r values. In FIGS. 6A-6B, the dummy cells have r values different from memory cells; in FIG. 6C, the dummy r values are same as memory cells. In these figures, numbers in double quotes are the code value stored at a cell; numbers in parentheses are its r value.

FIG. 6A illustrates a first preferred read-out circuit. Each N-MPM unit array needs at least N−1 dummy bit-lines. This preferred embodiment comprises four data bit-lines 30a-30d (collectively referred to as data group 30DT) and three dummy bit-lines 32a-32c (collectively referred to as dummy group 32DY). The dummy r values are between those of memory cells, e.g. the dummy r values are ⅙, ½, and ⅚; while the data r values are 0, ⅓, ⅔ and 1. The read-out circuit further comprises a column decoder (or a mux) 6 and an A/D converter 10. The column decoder 6 comprises switches 6a-6d, only one of which is allowed to turn on each time. The A/D converter 10 comprises comparators 8x-8z.

The read-out sequence for this preferred embodiment works as follows. To read out cell 1cc, switch 6c in the column decoder 6 is turned on. Bit-line signal 30c is sent to signal line 11 and then to the A/D converter 10. It is further compared with the dummy bit-line signals 32a-32c at each comparator 8x-8z. Because cell 1cc carries "$2_4$", the A/D converter output 2x-2y is 1, 1, 0. This output can be used to retrieve digital information stored at cell 1cc.

FIG. 6B illustrates a second preferred read-out circuit. In this preferred embodiment, each data bit-line 30a-30d is connected with one input of comparator 8a-8d; each dummy bit-line (32a-32c) is connected to signal line 13 through a column decoder (or a mux) 4; signal line 13 is fed into the other input of all comparators 8a-8d. The column decoder 4 comprises switches 4a-4c, only one of which is allowed to turn on each time. Optionally, a 1× driver 15 can be added to signal line 13 to help drive the inputs of comparators 8a-8d. Each read action needs at least N−1 (i.e. 3 for this preferred embodiment) read cycles:

A) During the first read cycle, only switch 4a is turned on. Dummy signal 32a is compared with data bit-line signals 30a-30d at comparators 8a-8d. The outputs 2a-2d are 0, 1, 1, 1 and stored in a first buffer.

B) During the second read cycle, only switch 4b is turned on. Dummy signal 32b is compared with data bit-line signals 30a-30d at each comparators 8a-8d. The outputs 2a-2d are 0, 0, 1, 1 and stored in a second buffer.

C) During the third read cycle, only switch 4c is turned on. Dummy signal 32b is compared with data bit-line signals 30a-30d at comparators 8a-8d. The outputs 2a-2d are 0, 0, 0, 1 and stored in a third buffer.

D) Finally, outputs stored in the first, second and third buffers are used to calculate back digital information stored at cells 1ca-1cd.

FIG. 6C illustrates a third preferred read-out circuit. Instead of using dummy cells with r values different from memory cells (FIGS. 6A-6B), the dummy cells 1c0'-1c3' in this preferred embodiment use the same r values as memory cells 1ca-1cd, i.e. 0, ⅓, ⅔, and 1. Each N-MPM unit array needs N dummy bit-lines. Decoder (or a mux) 14 comprises three switch signals 14a-14c. Each switch signal (e.g. 14a) can simultaneously turn on two switches (e.g. 4e and 4f) and connect two bit-lines (e.g. 34a and 34b) to a same signal line 13. Because of this, the voltage on signal line 13 is effectively the average voltage of these two bit-lines (e.g. 34a and 34b). Thus, the equivalent dummy r value during this read cycle is ⅙, same as dummy cell 1c0. The rest of read-out operation is same as that in FIG. 6B. Because dummy cells use the same r values as memory cells, the opening mask becomes easier to make. This can help further reduce the mask cost.

Figure 7:
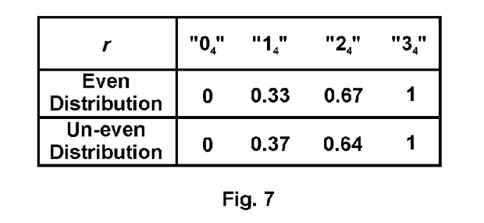
FIG. 7 illustrates two sets of preferred contact-area ratios (r) for a 4-MPM.

Referring now to FIG. 7, two sets of preferred r values for a 4-MPM are disclosed. In the first set, r values are evenly distributed between 0 (no-contact) and 1 (full-contact). This r distribution is suitable for an ideal manufacturing condition, e.g. there is no mis-alignment during lithography. For the second set, r values are distributed un-evenly, e.g. the first r increment (Δr) (Δr=0.37 from "$0_4$" to "$1_4$") is larger than the middle Δr (Δr=0.27 from "$1_4$" to "$2_4$"). This r set can better accommodate mis-alignment during lithography and provide a wider process margin. For example, if the upper-ASL mask is mis-aligned to the opening mask by 10% along −y direction (FIG. 5B), for the first r set, the effective r values for "$0_4$"-"$3_4$" cells become 0.1, 0.43, 0.77, 1 (on silicon) and Δr could be as small as 0.23; for the second r set, the effective r values are 0.1, 0.47, 0.74, 1 (on silicon) and the smallest Δr is 0.26, larger than the first set. A larger Δr can reduce the complexity in read-out circuit design. Eq. (1) discloses a preferred method to calculate r values for memory cells, taking into account of mis-alignment:

$r[0_N]=0$ $r[i_N]=MA+i\times x$ ($i=1 \ldots N-2$);

$r[(N-1)_N]=1$, and $x=(1-2\times MA)/(N-1)$,　　　　　　　　　　Eq. (1)

where, MA is the maximum allowed mis-alignment in unit of F

Figure 8A:
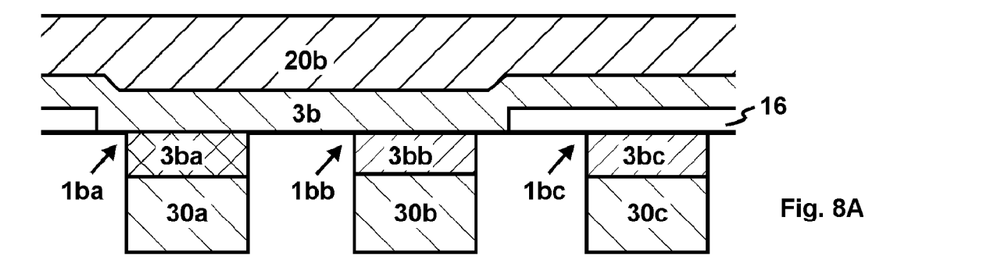
FIG. 8A illustrates a preferred junction-defined N-MPM.
Figure 8B:
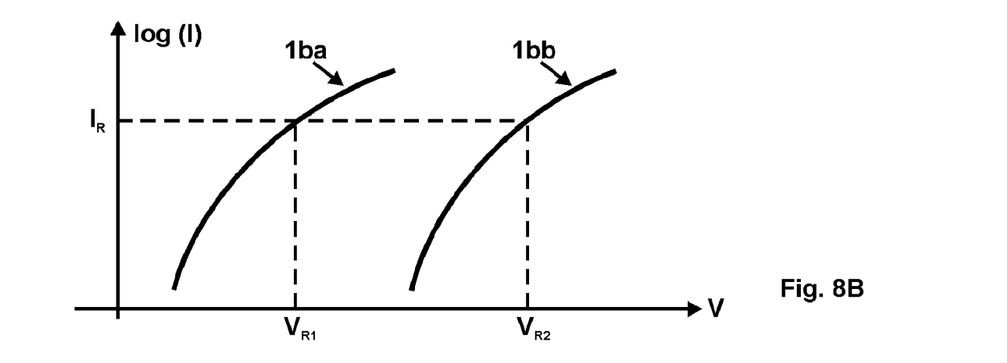
FIG. 8B illustrates its IV characteristics.

Besides geometry-defined, N-MPM can also be junction-defined. In a junction-defined N-MPM, distinct cell-states are defined by varying junction properties. A commonly varied junction property is doping profile. With different doping profiles, the cell IV characteristics vary. FIG. 8A illustrates a preferred junction-defined N-MPM. It is a 3-MPM and its cells 1ba-1bc have different junction properties: junction 3ba in cell 1ba is more heavily doped than junction 3bb in cell 1bb; and junction 3bc in cell 1bc comprises an insulating dielectric 16. Accordingly, cell 1ba conducts more current than cell 1bb, and cell 1bc conducts no current; for the same read current $I_R$, cell 1bb needs a larger read voltage $V_{R2}$ than cell 1ba, i.e. $V_{R1}$ (FIG. 8B).

Figure 9A:
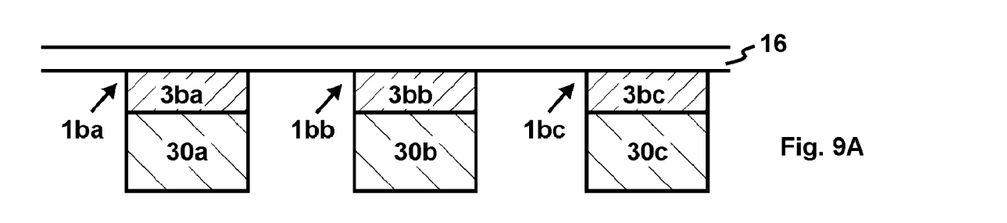
FIGS. 9A-9C illustrate a preferred manufacturing process of a junction-defined N-MPM.
Figure 9B:
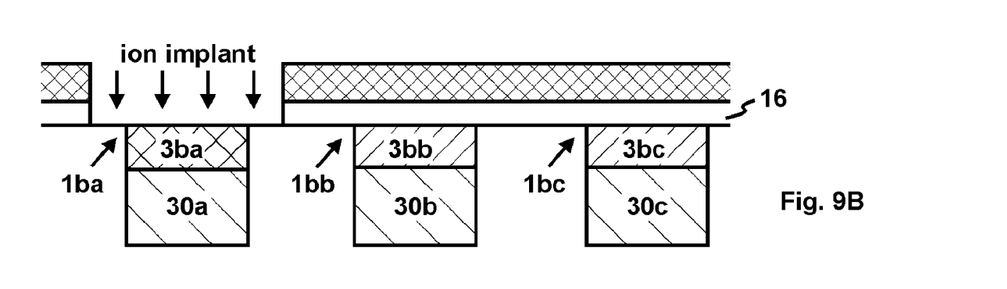
Figure 9C:
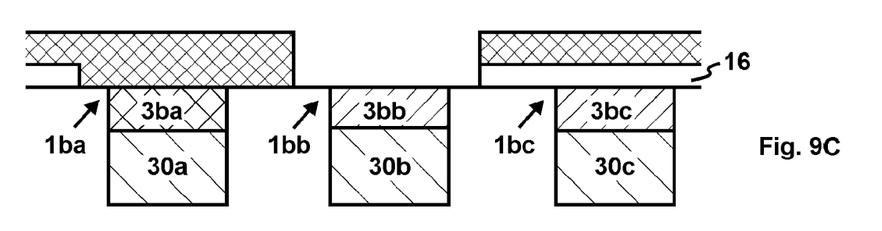

FIGS. 9A-9C illustrate a preferred manufacturing process of a junction-defined N-MPM. It comprises the following steps: A) form lower ASL's 30a, 30b, 30c. Each lower ASL comprises an N-layer 3ba-3bc. At this step, all these N-layers 3ba-3bc have the same doping profile. After this, form an insulating dielectric 16 on top of the lower ASL's (FIG. 9A); B) apply a first opening mask and etch away the insulating dielectric 16 in cell area 1ba. Perform ion implantation, which will increase the doping concentration in junction 3ba (FIG. 9B); C) apply a second opening mask and etch away the insulating dielectric 16 in cell 1bb (FIG. 9C); D) Remove photo-resist and form top ASL 20b, including P-layer 3b (FIG. 8A).

Figure 10A:
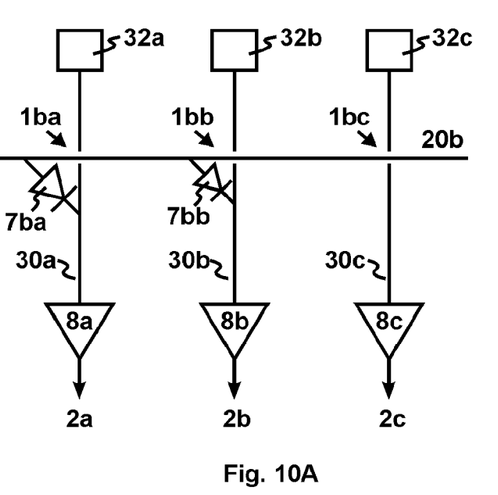
FIG. 10A illustrates a preferred read-out circuit for a junction-defined N-MPM.
Figure 10B:
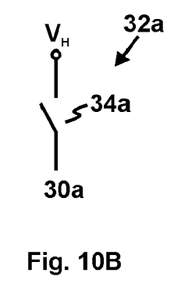
FIG. 10B illustrates a preferred current-limiting circuit.

FIG. 10A illustrates a preferred read-out circuit for a junction-defined N-MPM. The larger diode 7ba drawn at cell 1ba represents a larger current-conductivity of cell 1ba. Each bit line (e.g. 30a) is connected to a sense-amp (e.g. 8a) and a current-limiting circuit (e.g. 32a). The sense-amp 8a flips its output 2a when the voltage-rise on ASL 30a (i.e. bit line) exceeds a threshold-voltage. The current-limiting circuit 32a limits the current flow through the diode 7ba. As is illustrated in FIG. 10B, it may comprise a switch 34a and a voltage source $V_H$. The switch 34a is controlled by the output 2a of the sense-amp 8a. When the output 2a is high, the switch 34a is turned on and the voltage on ASL 30a becomes tied to $V_H$.

Figure 10C:
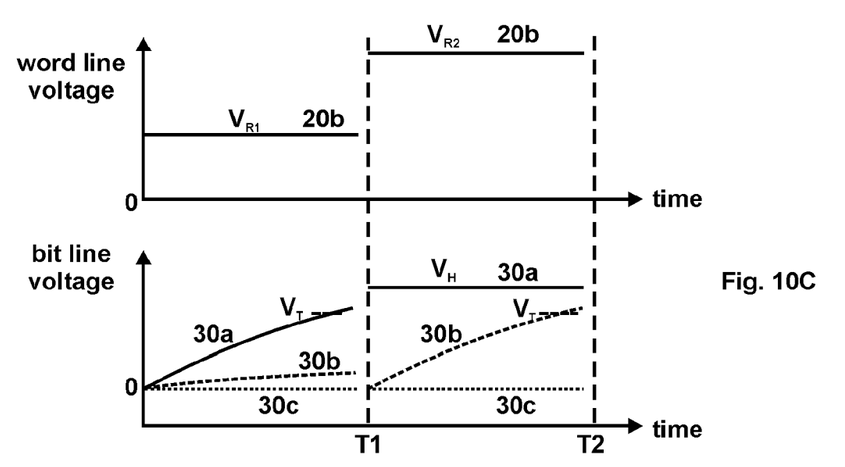
FIG. 10C is a timing-diagram of the word-line voltage and bit-line voltage during read.

FIG. 10C is a timing-diagram of the word-line voltage and bit-line voltage. This read-out process comprises two read-phases T1, T2. During T1, read voltage $V_{R1}$ is applied to word line (i.e. ASL 20b). Cell 1ba conducts the read current $I_R$. When its bit line (i.e. ASL 30a) voltage rises above the threshold-voltage $V_T$, cell 1ba is sensed as "1". On the other hand, cell 1bb conducts less current than 1ba and cannot trigger the sense-amp 8b during T1, neither does 1bc. They are sensed as "0". During T2, read voltage $V_{R2}$ ($V_{R2}>V_{R1}$) is applied to word line 20b. With this larger read voltage (FIG. 8B), cell 1bb conducts the read current $I_R$ and is sensed as "1", while cell 1bc still conducts no current and is again sensed as "0". It should be noted that during T2, current-limiting circuit 32a for cell 1ba is turned on. As a result, the voltage on bit line 30a rises to $V_H$ and voltage drop on the diode 7ba becomes $V_{R2}-V_H$. With a smaller voltage drop, the current flow through the diode 7ba can be small enough to cause any damage thereto. After T1, T2, information stored in cells 1ba-1bc can be calculated back based on the outputs 2a-2c obtained in these read-phases.

Besides geometry-defined and junction-defined N-MPM's, other forms of N-MPM may be used. One example is hybrid N-MPM. It combines geometry-defined N-MPM and junction-defined N-MPM. To be more specific, both of its cell geometries and junction properties are varied for different cell-states. As a result, an even large number of bits can be stored in each cell.

Figure 11:
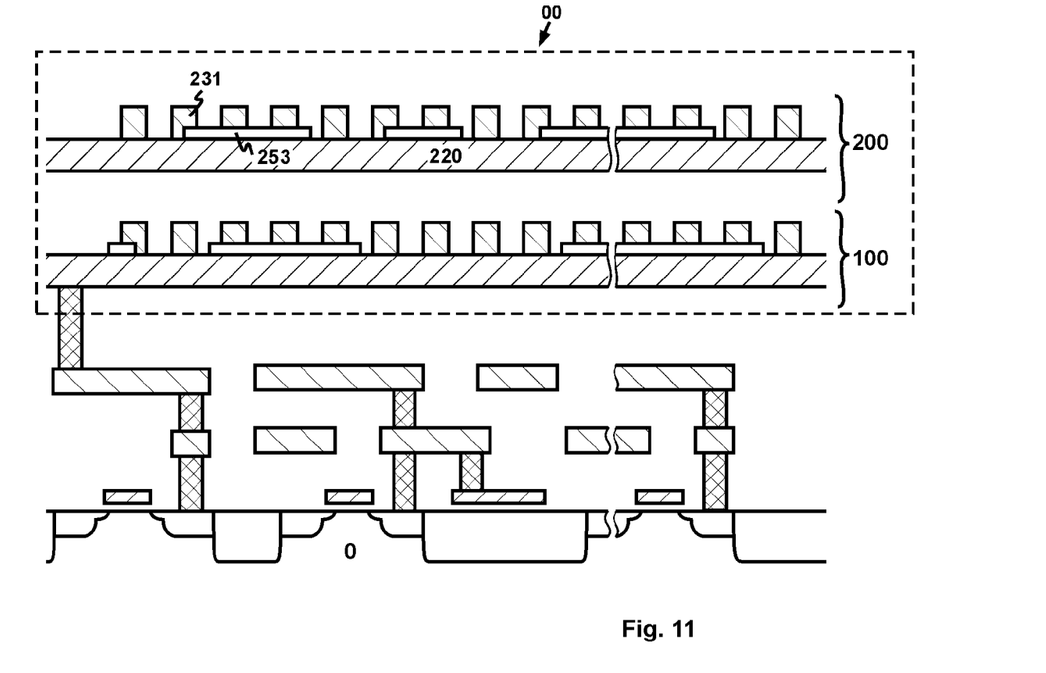
FIG. 11 illustrates a preferred three-dimensional (3-D) N-MPM.

Referring now to FIG. 11, a preferred three-dimensional (3-D) N-MPM is disclosed. 3-D MPM (also known as 3D-ROM) has been disclosed in details in U.S. Pat. No. 5,835,396, entitled "Three-dimensional read-only memory"; U.S. Pat. No. 6,717,222, entitled "Three-dimensional memory", both by the same inventor. In this preferred embodiment, 3D-ROM structure 00 comprises two memory levels 100, 200. Memory level 100 is stacked above the substrate 0 and memory level 200 is stacked above the memory level 100. Upper ASL 231, insulating dielectric 253, and lower ASL 220 form N-MPM cells. 3-D N-MPM combines N-ary storage with 3-D stacking and will achieve a storage density far larger than any known solid-state storage: with 8-level and 2-bit/cell, its storage density can reach as high as ~5 GByte/cm$^2$ at the 90 nm node.

Figure 12:
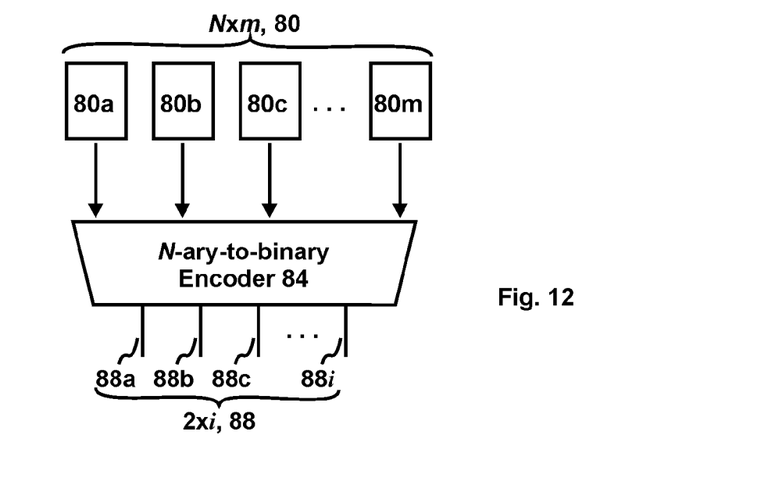
FIG. 12 illustrates a preferred fractional-bit-based N-MPM.

In an N-MPM, each cell could store an integral number of bits, or fractional number of bits. When N is an integral power of 2 (i.e. N=2$^n$, n is an integer), each N-MPM cell can represent integral bits (i.e. n bit, n≧2 is an integer). When N is a non-integral power of 2 (i.e. N=2$^x$, x is a non-integer), a plurality of cells are decoded collectively—in unit of word. As is illustrated in FIG. 12, each word 80 comprises m N-MPM cells 80a, 80b ... 88m (m—word-width, m≧2 is an integer). They are fed into an N-ary-to-binary encoder 84 and converted into i binary bit 88 (comprising 88a, 88b ... 88i), where $i \leq INT[\log_2(N^m)]$ (INT[x] is the largest integer smaller than x). By averaging i bits into m cells, each N-MPM cell effectively represents fractional bits.

Details on fractional-bit-based N-MPM can be found in the co-pending U.S. patent application Ser. No. 10/907,381, entitled "Fractional-Bit Systems", filed Mar. 31, 2005 by the same inventor. Below are some conclusions drawn in the aforementioned application:

1) Preferably the system efficiency β=INT[$\log_2(N^m)$]/$\log_2(N^m)$≧90%, namely,
 A) for N=5, m≧4;
 B) for N=7, 11, 15, m≧3;
 C) for N=6, 12, 13, 14, m≧2; or
 D) for N=9, 10, m≧1.

or,

2) Preferably the system efficiency β=INT[$\log_2(N^m)$]/$\log_2(N^m)$ reaches local maximum, namely,
 A) for N=5, m=4, 7, 10, 13, 16, 19, 22, 25, 28, or 32;
 B) for N=6, m=2, 4, 7, 9, 12, 14, 16, 19, 21, 24, 26, 28, or 31;
 C) for N=7, m=5, 10, 15, 20, 25, or 31;
 D) for N=9, m=6, 12, 18, 24, or 30;
 E) for N=10, m=4, 7, 10, 13, 16, 19, 22, 25, or 28;
 F) for N=11, m=3, 5, 7, 9, 11, 14, 16, 18, 20, 22, 24, 27, 29, or 31;
 G) for N=12, m=2, 4, 7, 9, 12, 14, 16, 19, 21, 24, 26, 28, or 31;
 H) for N=13, m=3, 6, 10, 13, 16, 20, 23, 26, or 30;
 I) for N=14, m=5, 10, 15, 20, 25, or 31; or
 J) for N=15, m=10, 21, or 32.

While illustrative embodiments have been shown and described, it would be apparent to those skilled in the art that may more modifications than that have been mentioned above are possible without departing from the inventive concepts set forth therein. The invention, therefore, is not to be limited except in the spirit of the appended claims.

What is claimed is:

1. An N-ary mask-programmable memory, comprising:
 a plurality of lower address-selection lines;
 a plurality of upper address-selection lines above said lower address-selection lines;
 a plurality of mask-programmable memory cells coupled to said lower and upper address-selection lines, each of said memory cells comprising a diode-like device and having one of at least N possible cell-states with N>2;

wherein, memory cells in a same cell-state have substantially the same geometry, and memory cells in at least three different cell-states have different geometries and have different ranges of read current at a read voltage.

2. The N-ary mask-programmable memory according to claim 1, further comprising a memory cell coupled to a lower address-selection line and an upper address-selection line, said memory cell further comprising a contact-area smaller than the overlapping area between said lower and upper address-selection lines, wherein said contact-area is the smallest current conduction area in said memory cell.

3. The N-ary mask-programmable memory according to claim 2, wherein an edge of said contact-area aligns with an edge of said upper address-selection line.

4. The N-ary mask-programmable memory according to claim 3, further comprising:
a first memory cell coupled to a first upper address-selection line, said first memory cell having a first contact-area, an edge of said first contact-area aligning with a first edge of said first upper address-selection line;
a second memory cell coupled to a second upper address-selection line, said second memory cell having a second contact-area, an edge of said second contact-area aligning with a second edge of said second upper address-selection line;
wherein said first and second upper address-selection lines are adjacent and parallel, and said first and second edges are opposite.

5. The N-ary mask-programmable memory according to claim 2, wherein the sizes of contact-areas from different cell-states are unevenly distributed.

6. The N-ary mask-programmable memory according to claim 1, further comprising a plurality of vertically stacked memory levels, wherein said mask-programmable memory cells are located in at least one of said memory levels.

7. The N-ary mask-programmable memory according to claim 1, wherein N is a non-integral power of 2, and said mask-programmable memory further comprises means for converting N-ary data to binary.

8. The N-ary mask-programmable memory according to claim 1, wherein memory cells in at least two different cell-states have different junctions.

9. An N-ary mask-programmable memory, comprising:
a plurality of lower address-selection lines;
a plurality of upper address-selection lines above said lower address-selection lines;
a plurality of mask-programmable memory cells coupled to said lower and upper address-selection lines, each of said memory cells comprising a diode-like device and having one of at least N possible cell-states with N>2;
wherein, memory cells in a same cell-state have substantially the same junction, and memory cells in at least two different cell-states have different junctions and have different ranges of read current at a read voltage.

10. The N-ary mask-programmable memory according to claim 9, wherein said diode-like device has a doping profile, and memory cells in at least two different cell-states have different doping profiles.

11. The N-ary mask-programmable memory according to claim 9, further comprising means for limiting the read current through the memory cell under read.

12. The N-ary mask-programmable memory according to claim 9, wherein at least two read voltages are applied in sequence to a selected memory cell during read.

13. The N-ary mask-programmable memory according to claim 9, further comprising a plurality of vertically stacked memory levels, wherein said mask-programmable memory cells are located in at least one of said memory levels.

14. The N-ary mask-programmable memory according to claim 9, wherein N is a non-integral power of 2, and said mask-programmable memory further comprises means for converting N-ary data to binary.

15. The N-ary mask-programmable memory according to claim 9, wherein memory cells in at least two different cell-states have different geometries.

16. An N-ary mask-programmable memory, comprising:
a plurality of lower address-selection lines;
a plurality of upper address-selection lines above said lower address-selection lines;
a plurality of mask-programmable memory cells and dummy cells coupled to said lower and upper address-selection lines, each of said memory cells comprising a diode-like device and having one of at least N possible cell-states with N>2, wherein memory cells in different cell-states have different ranges of read current at a read voltage;
means for comparing a first input from a selected memory cell and a second input from a selected dummy cell.

17. The N-ary mask-programmable memory according to claim 16, wherein said second input is coupled to first and second dummy cells, said first dummy cell having a first one of said N cell-states and said second dummy cell having a second one of said N cell-states.

18. The N-ary mask-programmable memory according to claim 16, wherein memory cells in at least three different cell-states have different geometries.

19. The N-ary mask-programmable memory according to claim 16, wherein memory cells in at least two different cell-states have different junctions.

20. The N-ary mask-programmable memory according to claim 16, wherein N is a non-integral power of 2, and said mask-programmable memory further comprises means for converting N-ary data to binary.

* * * * *